(12) United States Patent
Chi et al.

(10) Patent No.: US 7,652,543 B2
(45) Date of Patent: Jan. 26, 2010

(54) ELECTRONIC ELEMENT ARRANGEMENT METHOD AND VOLTAGE CONTROLLED OSCILLATOR USING THE SAME

(75) Inventors: Li-Hung Chi, Taipei County (TW); Hisn-Kuang Chen, Taipei County (TW)

(73) Assignee: Princeton Technology Corporation, Taipei County (TW)

( * ) Notice: Subject to any disclaimer, the term of this patent is extended or adjusted under 35 U.S.C. 154(b) by 236 days.

(21) Appl. No.: 11/822,243

(22) Filed: Jul. 3, 2007

(65) Prior Publication Data

US 2008/0155487 A1     Jun. 26, 2008

(30) Foreign Application Priority Data

Dec. 21, 2006    (TW)    .............................. 95148281 A

(51) Int. Cl.
*H03B 1/00*    (2006.01)

(52) U.S. Cl. .......................................... 331/57; 331/45

(58) Field of Classification Search ................... 331/57, 331/45
See application file for complete search history.

(56) References Cited

U.S. PATENT DOCUMENTS 6,188,293 B1 *    2/2001    Miyagi et al. .................. 331/57
7,129,795 B2 *    10/2006    Okamura ...................... 331/57

* cited by examiner

*Primary Examiner*—Joseph Chang
(74) *Attorney, Agent, or Firm*—Muncy, Geissler, Olds & Lowe, PLLC

(57) ABSTRACT

A method for arranging electronic elements is provided. The method is suitable for a set of N electronic elements in which N is an odd number. The set of N electronic elements include a first electronic element subset and a second electronic element subset. The electronic elements of the first electronic element subset are arranged according a first predetermined method and the electronic elements of the second electronic element subset are arranged according to a second predetermined method, wherein the second electronic element subset is adjacent to the first electronic element subset.

19 Claims, 4 Drawing Sheets

ELECTRONIC ELEMENT ARRANGEMENT METHOD AND VOLTAGE CONTROLLED OSCILLATOR USING THE SAME

BACKGROUND OF THE INVENTION

1. Field of the Invention

The invention relates to an electronic elements arrangement method, and more particularly to a method for arranging electronic elements in an integrated circuit (IC) layout.

2. Description of the Related Art

A voltage controlled oscillator (VCO) typically comprises an odd number of inverters. The delay time of each inverter is utilized to generate an oscillating waveform of the VCO. If the number of inverters of the VCO is N, the period is $2N \times t_p$ and the oscillation frequency is $$\frac{1}{2N \times t_p}, t_p$$

being a propagation delay. The described inverters are controlled by input voltage from an input terminal to generate internal frequency oscillation. An output frequency is then generated at the output terminal.

FIG. 1 shows an integrated circuit (IC) layout schematic diagram of a conventional VCO with various inverters. As shown in FIG. 1, a conventional VCO comprises seven sequential inverters 121-127, first-seventh. Each inverter of seven inverters 121-127 comprises an input terminal 1211, 1221, 1231, 1241, 1251, 1261 and 1271 respectively and an output terminal 1212, 1222, 1232, 1242, 1252, 1262 and 1272 respectively. The inverters are connected in the manner described in the following. Output terminal 1212 of the first inverter 121 is coupled to input terminal 1221 of the second inverter 122. Output terminal 1222 of the second inverter 122 is coupled to input terminal 1231 of the third inverter 123. Output terminal 1232 of the third inverter 123 is coupled to input terminal 1241 of the fourth inverter 124. Output terminal 1242 of the fourth inverter 124 is coupled to input terminal 1251 of the fifth inverter 125. Output terminal 1252 of the fifth inverter 125 is coupled to input terminal 1261 of the sixth inverter 126. Output terminal 1262 of the sixth inverter 126 is coupled to input terminal 1271 of the seventh inverter 127; and output terminal 1272 of the seventh inverter 127 is coupled to input terminal 1211 of the first inverter 121, thus completing the VCO for generating frequency oscillation.

The connection between elements within the IC generates parasitic capacitance and parasitic resistance, thus the characteristics of the electronic element, such as the characteristics of the resistors and capacitors may be affected. As shown in FIG. 1, a conductive line coupled between the output terminal 1272 of the seventh inverter 127 and the input terminal 1211 of the first inverter 121 is longer than other conductive lines. Thus, the parasitic resistance generated in the conductive line coupled between the output terminal 1272 of the seventh inverter 127 and the input terminal 1211 of the first inverter 121 is different than that generated in other conductive lines. The phase offset thus causes a different delay in the signal of each inverter. If the VCO has a variety of inverters, the characteristics of the VCO are affected generating phase difference and frequency offset because the output characteristics of various inverters depend on the arrangement of electronic elements in the IC layout.

Thus, a VCO with stable output frequency is desirable.

BRIEF SUMMARY OF THE INVENTION

A method for arranging electronic elements for improving the offset characteristics of electronic elements due to mismatched connections in an IC layout is provided.

One embodiment of the invention discloses an electronic device. The electronic device comprises a set of N electronic elements in which N is an odd number, wherein the set of N electronic elements comprise a first electronic element subset and a second electronic element subset. The first electronic element subset is arranged according to a first predetermined method and the second electronic element subset is arranged according to a second predetermined method, wherein the second electronic element subset is adjacent to the first electronic element subset. A signal passing through the first electronic element to the $N^{th}$ electronic element of the set of N electronic elements in sequence, wherein the first predetermined method arranges the first electronic element subset in sequence from the first electronic element to the $N^{th}$ electronic element in an odd order, and the second predetermined method arranges the second electronic element subset in sequence from the second electronic element to the $(N-1)^{th}$ electronic element in an even order.

Another embodiment of the invention discloses a voltage controlled oscillator, comprising a set of N electronic elements and N is an odd number. The set of N electronic elements are coupled to a voltage source, and generate an output signal according to a first reference voltage, a second reference voltage and a control signal, wherein the set of N electronic elements comprise a first electronic element subset and a second electronic element subset. The first electronic element subset is arranged according to a first predetermined method, and the second electronic element subset is arranged according to a second predetermined method, wherein the second electronic element subset is adjacent to the first electronic element subset.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
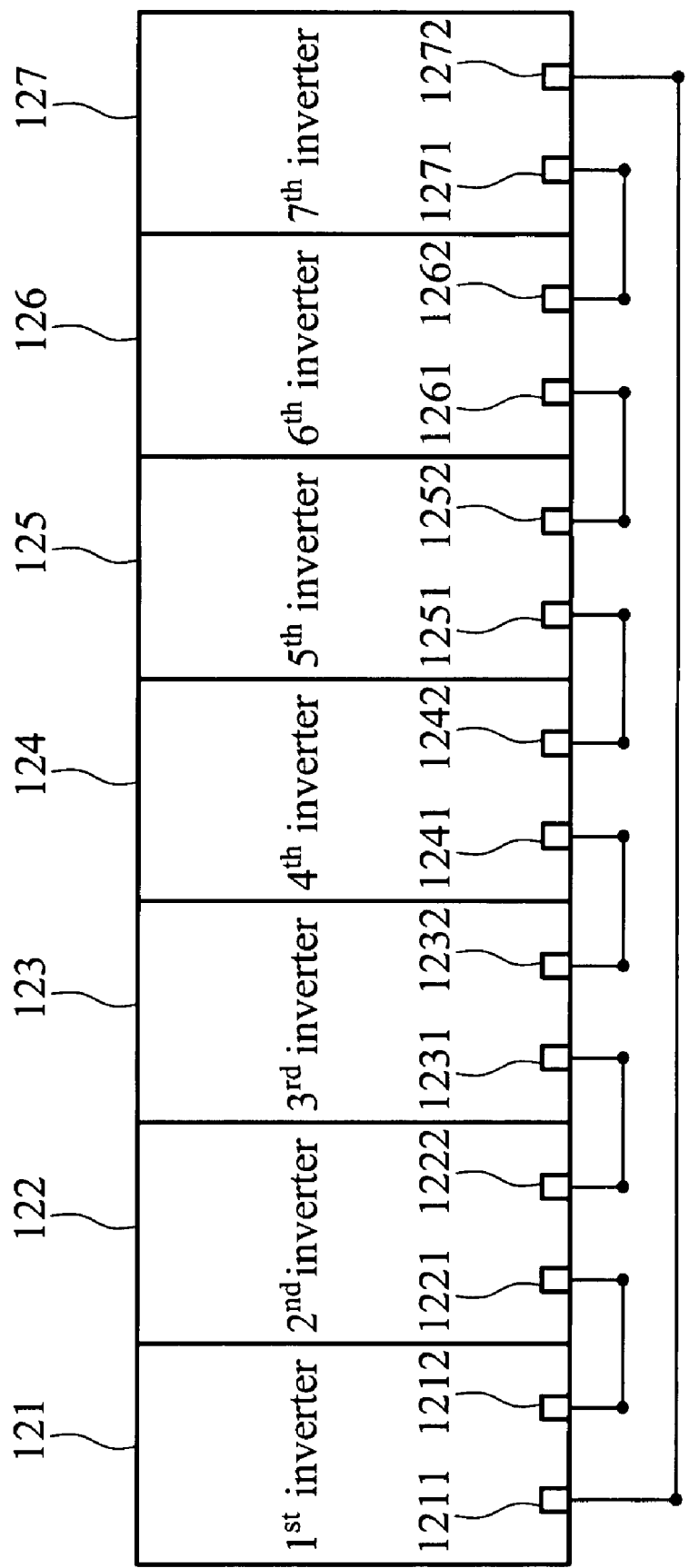
FIG. 1 is an IC layout schematic diagram of a conventional VCO with various inverters.
Figure 2:
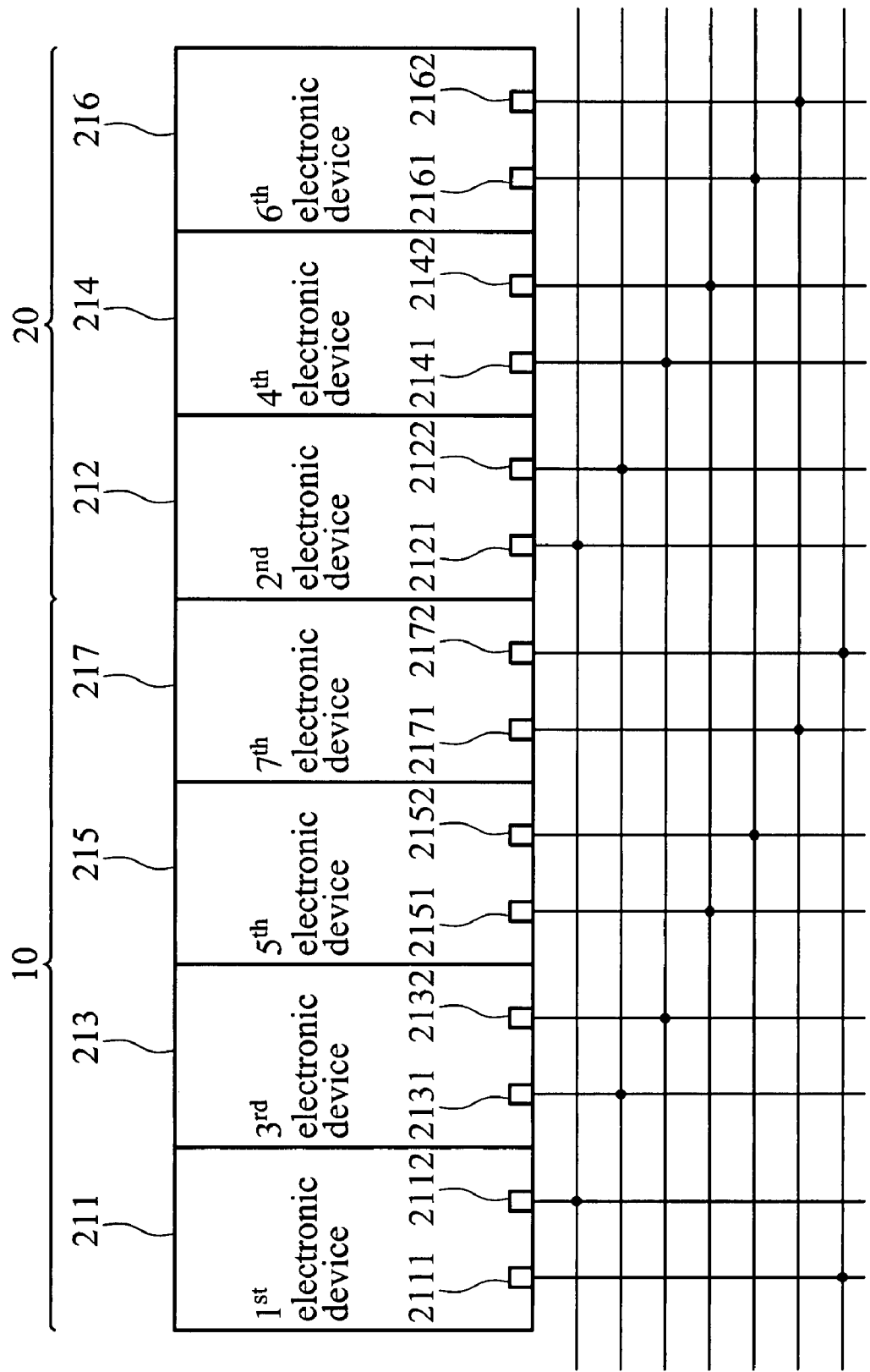
FIG. 2 is a schematic diagram of a method for arranging electronic elements according to the invention.
Figure 3:
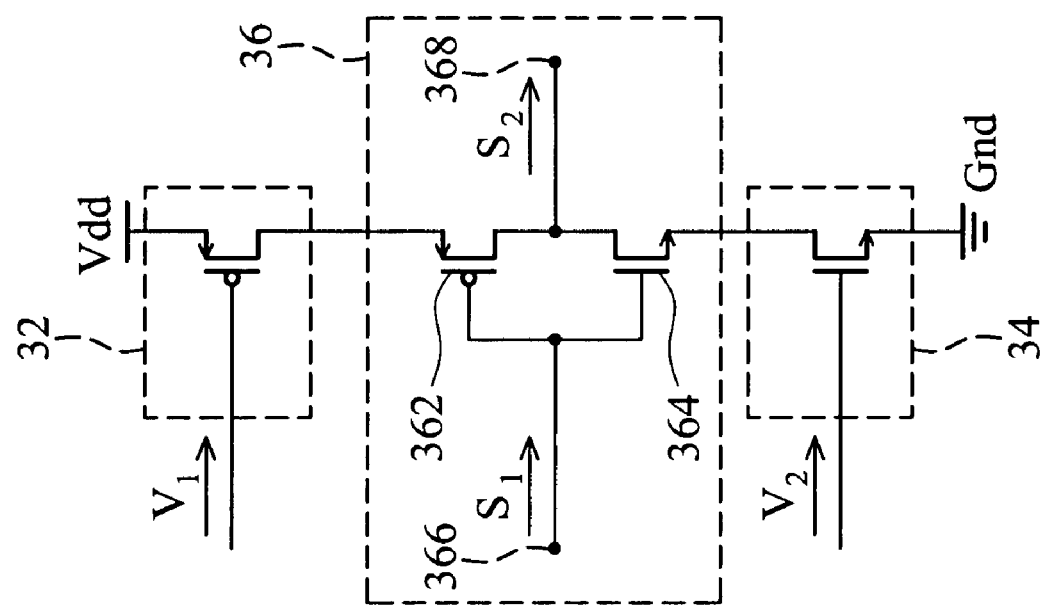
FIG. 3 is a schematic diagram of electronic element according to the method for arranging electronic elements of the invention.

The invention comprises a method for arranging electronic elements of N electronic elements, where N is an odd number. FIG. 2 is a schematic diagram of a method for arranging electronic elements according to the invention. FIG. 3 is a schematic diagram of electronic element according to the method for arranging electronic elements of the invention. In FIG. 2, N is equal to 7 and a set of seven electronic elements 211-217 are shown. The set of seven electronic elements 211-217 comprise a first electronic element subset 10 and a second electronic element subset 20. The first electronic element subset 10 is arranged according to a first predetermined method, and the second electronic element subset 20 is arranged according to a second predetermined method. The first electronic element subset 10 comprises four electronic elements 211, 213, 215 and 217 in odd order, i.e. the first, third, fifth and seventh electronic elements. The second electronic element subset 20 comprises the three electronic elements 212, 214 and 216 in even order, i.e. the second, fourth and sixth electronic elements, and the second electronic element subset 20 is adjacent to the first electronic element subset 10. A signal passing through the first electronic element 211 to the seventh electronic element 217 of the set of seven electronic elements 211-217 in sequence. The first predetermined method comprises arranging the first electronic element subset 10 in sequence from the first electronic element 211 to the seventh electronic element 217 in an odd order, and the second predetermined method comprises arranging the second electronic element subset 20 in sequence from the second electronic element 212 to the sixth electronic element 216 in an even order.

Each electronic element of the set of seven electronic elements 211-217 comprises an input terminal, i.e. input terminals 2111, 2121, 2131, 2141, 2151, 2161 and 2171 respectively, and an output terminal, i.e. output terminals 2112, 2122, 2132, 2142, 2152, 2162 and 2172 respectively, coupled to another two electronic elements respectively. The input terminal of the $n^{th}$ electronic element is coupled to the output terminal of the $(n-1)^{th}$ electronic element, wherein $1 \leq n \leq N$ and n is a positive integer, and the input terminal 2111 of the first electronic element 211 is coupled to the output terminal 2172 of the seventh electronic element 217. The method for arranging electronic elements 211-217 according to the invention is applied to an IC layout.

A control signal received by the $n^{th}$ electronic element is an output signal generated by the $(n-1)^{th}$ electronic element, wherein $1 \leq n \leq N$ and n is a positive integer, and the control signal received by the first electronic element 211 is the output signal generated by the $N^{th}$ electronic element. For example, if N is equal to 7, the control signal received by the first electronic element 211 is the output signal generated by the seventh electronic element 217.

As shown in FIG. 3, each electronic element 30 comprises a voltage source Vdd, a first transistor 32, a second transistor 34 and a switch element 36. In the embodiment, first transistor 32 is a PMOS transistor and second transistor 34 is an NMOS transistor. The first transistor 32 has a first source coupled to the voltage source Vdd, a first gate coupled to a first reference voltage $V_1$ and a first drain. The second transistor 34 has a second drain coupled to switch element 36, a second gate coupled to a second reference voltage $V_2$ and a second source coupled to a ground (Gnd).

The switch element 36 is coupled between the first drain of first transistor 32 and the second drain of second transistor 34 for receiving a control signal $S_1$ and generating an output signal $S_2$ according to the first reference voltage $V_1$, the second reference voltage $V_2$ and the control signal $S_1$. The switch element 36 further comprises a PMOS switch 362, an NMOS switch 364, an input terminal 366 and an output terminal 368. The PMOS switch 362 is coupled to the first drain of first transistor 32, and has a third gate and a third drain. The NMOS switch 364 is coupled between the PMOS switch 362 and the second drain of second transistor 34, and has a fourth gate and a fourth drain. The input terminal 366 is coupled between the third gate of PMOS switch 362 and the fourth gate of NMOS switch 364 for receiving the control signal $S_1$. The output terminal 368 is coupled between the third drain of PMOS switch 362 and the fourth drain of NMOS switch 364 for generating the output signal $S_2$ according to the first reference voltage $V_1$, the second reference voltage $V_2$ and the control signal $S_1$.

In one embodiment of the invention, each electronic element is a delay cell. In another embodiment of the invention, each electronic element is an inverter.

Figure 4:
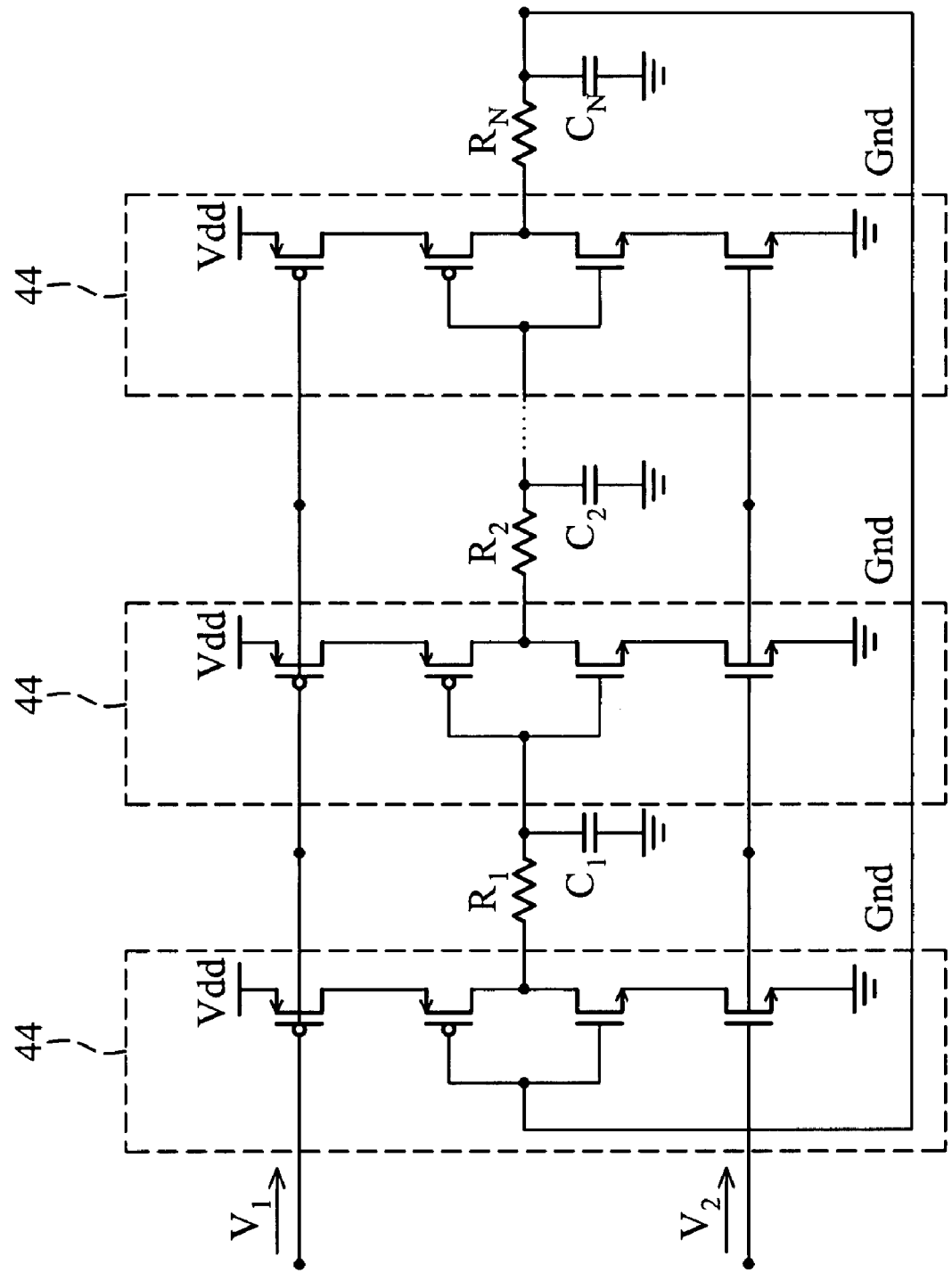
FIG. 4 is a schematic diagram of a VCO according the method for arranging electronic elements according to the invention.

FIG. 4 is a schematic diagram of a VCO according the method for arranging electronic elements according to the invention. As shown in FIG. 4, the invention further provides a VCO having a set of N electronic elements 44, wherein N is an odd number. The set of N electronic elements 44 are coupled to a voltage source Vdd. The set of N electronic elements 44 respectively generate an output signal according to a first reference voltage $V_1$, a second reference voltage $V_2$ and a control signal. The set of N electronic elements 44 comprise a first electronic element subset and a second electronic element subset. The first electronic element subset is arranged according to a first predetermined method, and the second electronic element subset is arranged according to a second predetermined method, wherein the second electronic element subset is adjacent to the first electronic element subset. Each electronic element 44 generates parasitic capacitance and parasitic resistance due to the effects of the connection, such as parasitic resistors $R_1$-$R_N$ and parasitic capacitor $C_1$-$C_N$. According to the arrangement shown in FIG. 2, each of the parasitic resistors, $R_1$-$R_N$, is substantially equal.

As described, the method for arranging electronic elements according to the invention and a VCO using the same arranges the electronic elements of an IC layout in a specific arrangement order, and the parasitic capacitors and parasitic resistors are substantially the same. Offset characteristics of the conventional arrangement method are effectively reduced, and the matching of capacitors and resistors caused by connection between various electronic elements is improved. The circuit utilizing the method for arranging electronic elements according to the invention is thus more accurate. In the VCO with a plurality of inverters according the method for arranging electronic elements according to the invention, the phase differences between signals are substantially equal, because the parasitic resistor of each inverter is substantially the same, thus, the delay of the signal of each inverter is the same. Thus, the output phase difference is controlled accurately by the VCO to obtain the uniform phase offset between VCOs.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A method for arranging electronic elements of a set of N electronic elements in which N is an odd number, the set of N electronic elements comprising a first electronic element subset and a second electronic element subset, the method comprising:

arranging the first electronic element subset according to a first predetermined method; and arranging the second electronic element subset according to a second predetermined method, wherein the second electronic element subset is adjacent to the first electronic element subset with a sequential alignment, wherein a signal sequentially passes through the set of N electronic elements from a first electronic element to an $N^{th}$ electronic element, wherein the first electronic element subset includes an odd-number sequence of the N electronic elements and the second electronic element subset includes an even-number sequence of the N electronic elements, wherein the first predetermined method comprises sequentially arranging the first electronic element to the $N^{th}$ electronic element, and the second predetermined method comprises sequentially arranging a second electronic element to a $(N-1)^{th}$ electronic element.

2. The method for arranging electronic elements as claimed in claim 1, wherein the electronic element comprises an input terminal and an output terminal, the input terminal of the $n^{th}$ electronic element is coupled to the output terminal of the $(n-1)^{th}$ electronic element, wherein $1 \leq n \leq N$ and n is a positive integer, and the input terminal of the first electronic element is coupled to the output terminal of the $N^{th}$ electronic element.

3. The method for arranging electronic elements as claimed in claim 1, wherein each electronic element comprises:
a first transistor having a first source coupled to a voltage source, a first gate coupled to a first reference voltage and a first drain;
a second transistor having a second drain coupled to the first drain, a second gate coupled to a second reference voltage and a second source coupled to a ground; and
a switch element coupled between the first drain and the second drain, receiving a control signal and generating an output signal according to the first reference voltage, the second reference voltage and the control signal.

4. The method for arranging electronic elements as claimed in claim 3, wherein the control signal received by the $n^{th}$ electronic element is the output signal generated by the $(n-1)^{th}$ electronic element, $1 \leq n \leq N$ and n is a positive integer, and the control signal received by the first electronic element is the output signal generated by the $N^{th}$ electronic element.

5. The method for arranging electronic elements as claimed in claim 3, wherein the first transistor is a PMOS transistor and the second transistor is an NMOS transistor.

6. The method for arranging electronic elements as claimed in claim 5, wherein the switch element comprises:
a PMOS switch coupled to the first drain, having a third gate and a third drain;
an NMOS switch coupled between the PMOS switch and the second drain, having a fourth gate and a fourth drain;
an input terminal coupled between the third gate and the fourth gate, receiving the control signal; and
an output terminal coupled between the third drain and the fourth drain, generating the output signal according to the first reference voltage, the second reference voltage and the control signal.

7. The method for arranging electronic elements as claimed in claim 1, wherein the electronic element is a delay cell.

8. The method for arranging electronic elements as claimed in claim 1, wherein the electronic element is an inverter.

9. The method for arranging electronic elements as claimed in claim 1, wherein the method for arranging electronic elements is applied to an integrated circuit layout.

10. The method for arranging electronic elements as claimed in claim 1, wherein the second electronic element is arranged adjacent to the $N^{th}$ electronic element.

11. A voltage controlled oscillator, comprising:
a set of N electronic elements in which N is an odd number, coupled to a voltage source, generating an output signal according to a first reference voltage, a second reference voltage and a control signal respectively,
wherein the set of N electronic elements comprise a first electronic element subset and a second electronic element subset, and the first electronic element subset is arranged according to a first predetermined method and the second electronic element subset is arranged according to a second predetermined method, wherein the second electronic element subset is adjacent to the first electronic element subset with a sequential alignment, wherein a signal sequentially passes through the set of N electronic elements from a first electronic element to an $N^{th}$ electronic element, wherein the first electronic element subset includes an odd-number sequence of the N electronic elements and the second electronic element subset includes an even-number sequence of the N electronic elements, wherein the first predetermined method comprises sequentially arranging the first electronic element to the $N^{th}$ electronic element, and the second predetermined method comprises sequentially arranging a second electronic element to a $(N-1)^{th}$ electronic element.

12. The voltage controlled oscillator as claimed in claim 11, wherein each electronic element comprises an input terminal and an output terminal, the input terminal of the $n^{th}$ electronic element is coupled to the output terminal of the $(n-1)^{th}$ electronic element, wherein $1 \leq n \leq N$ and n is a positive integer, and the input terminal of the first electronic element is coupled to the output terminal of the $N^{th}$ electronic element.

13. The voltage controlled oscillator as claimed in claim 11, wherein each electronic element comprises:
a first transistor having a first source coupled to the voltage source, a first gate coupled to the first reference voltage and a first drain;
a second transistor having a second drain coupled to the first drain, a second gate coupled to the second reference voltage and a second source coupled to a ground; and
a switch element coupled between the first drain and the second drain, receiving the control signal and generating the output signal according to the first reference voltage, the second reference voltage and the control signal.

14. The voltage controlled oscillator as claimed in claim 13, wherein the control signal received by the $n^{th}$ electronic element is the output signal generated by the $(n-1)^{th}$ electronic element, wherein $1 \leq n \leq N$ and n is a positive integer, and the control signal received by the first electronic element is the output signal generated by the $N^{th}$ electronic element.

15. The voltage controlled oscillator as claimed in claim 11, wherein the first transistor is a PMOS transistor and the second transistor is an NMOS transistor.

16. The voltage controlled oscillator as claimed in claim 15, wherein the switch element comprises:
a PMOS switch coupled to the first drain, having a third gate and a third drain;
an NMOS switch coupled between the PMOS switch and the second drain, having a fourth gate and a fourth drain;
an input terminal coupled between the third gate and the fourth gate, receiving the control signal; and
an output terminal coupled between the third drain and the fourth drain, generating the output signal according to the first reference voltage, the second reference voltage and the control signal.

17. The voltage controlled oscillator as claimed in claim 11, wherein the electronic element is a delay cell.

18. The voltage controlled oscillator as claimed in claim 11, wherein the electronic element is an inverter.

19. The voltage controlled oscillator as claimed in claim 11, wherein the second electronic element is arranged adjacent to the $N^{th}$ electronic element.

* * * * *